(12) United States Patent
Kao et al.

(10) Patent No.: US 6,819,565 B2
(45) Date of Patent: Nov. 16, 2004

(54) CAVITY-DOWN BALL GRID ARRAY SEMICONDUCTOR PACKAGE WITH HEAT SPREADER

(75) Inventors: Nai-Hao Kao, Taichung (TW); Yu-Po Wang, Taichung (TW); Wen-Jung Chiang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 115 days.

(21) Appl. No.: 10/341,711

(22) Filed: Jan. 14, 2003

(65) Prior Publication Data

US 2004/0070948 A1 Apr. 15, 2004

(30) Foreign Application Priority Data

Oct. 14, 2002 (TW) .................................. 91123546 A

(51) Int. Cl.[7] .................................................. H05K 7/20
(52) U.S. Cl. ..................... 361/704; 165/80.2; 165/80.3; 165/185; 257/707; 257/713; 257/738; 257/778; 257/774; 361/707; 361/708; 361/717; 361/718; 361/722
(58) Field of Search ............................... 165/80.2, 80.3, 165/185; 174/16.3; 257/706–707, 712–713, 738, 778, 774, 780; 361/687–722

(56) References Cited

U.S. PATENT DOCUMENTS

| | | | |
|---|---|---|---|
| 5,239,198 A | * | 8/1993 | Lin et al. ..................... 257/693 |
| 5,545,923 A | | 8/1996 | Barber |
| 5,583,378 A | * | 12/1996 | Marrs et al. ................. 257/710 |
| 5,633,533 A | * | 5/1997 | Andros et al. .............. 257/707 |
| 5,640,047 A | * | 6/1997 | Nakashima ................. 257/738 |
| 5,937,320 A | | 8/1999 | Andricacos et al. |
| 6,020,637 A | * | 2/2000 | Karnezos ..................... 257/738 |
| 6,483,187 B1 | * | 11/2002 | Chao et al. ................. 257/712 |

* cited by examiner

Primary Examiner—Gregory D. Thompson
(74) Attorney, Agent, or Firm—Peter F. Corless; Steven M. Jensen; Edwards & Angell, LLP

(57) ABSTRACT

A cavity-down ball grid array (CDBGA) semiconductor package with a heat spreader is provided, in which a substrate is formed with at least a ground ring, a plurality of ground vias, a ground layer, and at least an opening for receiving at least a chip. The substrate is mounted in a cavity of the heat spreader, and an electrically conductive adhesive is disposed between an inner wall of the cavity and edges of the substrate, so as to allow the ground layer and the ground ring exposed to the edges of the substrate to be electrically connected to the heat spreader by means of the electrically conductive adhesive. By the above arrangement with the heat spreader being included in a grounding circuit path of the chip, ground floatation and excess ground inductance and resistance can be prevented for the semiconductor package, thereby solving heat-dissipation, electromagnetic interference and crosstalk problems.

10 Claims, 3 Drawing Sheets

CAVITY-DOWN BALL GRID ARRAY SEMICONDUCTOR PACKAGE WITH HEAT SPREADER

FIELD OF THE INVENTION

The present invention relates to semiconductor packages, and more particularly, to a cavity-down ball grid array (CDBGA) semiconductor package with a heat spreader.

BACKGROUND OF THE INVENTION

A ball grid array (BGA) semiconductor package adopts advanced packaging technology, characterized in the use of a substrate with at least a semiconductor chip being mounted on a surface thereof and a plurality of array-arranged solder balls being implanted on an opposing surface of the substrate, so as to allow more input/output (I/O) connections (e.g. solder balls) to be implanted on a chip carrier (e.g. substrate) in response to high integration of the chip, to thereby electrically connect the semiconductor package to an external printed circuit board (PCB) by means of the solder balls.

U.S. Pat. No. 5,545,923 discloses a semiconductor package with a ground ring, a power ring and a plurality of signal fingers being formed on a substrate. As shown in FIG. 1a, in this semiconductor package 1, the ground ring 113, power ring 114 and signal fingers 115 are disposed at area other than a chip attach region 110 on a first surface 111 of the substrate 11. A semiconductor chip 12 having a plurality of ground pads, power pads and signal pads (not shown) is mounted on the chip attach region 110. A wire-bonding process is performed to form a plurality of ground wires 133, power wires 134 and signal wires 135, wherein the ground wires 133 electrically connect the ground pads of the semiconductor chip 12 to the ground ring 13 of the substrate 11, the power wires 134 electrically connect the power pads of the semiconductor chip 12 to the power ring 114 of the substrate 11, and the signal wires 135 electrically connect the signal pads of the semiconductor chip 12 to the signal fingers 115 of the substrate 11. Then, a plurality of solder balls 14 are implanted on a second surface 112 of the substrate 11, and electrically connected to the corresponding ground ring 113, power ring 114 and signal fingers 115 respectively via conductive traces (not shown) formed on the second surface 112 of the substrate 11. By electrically connecting the semiconductor package 1 to an external device via the solder balls 14, the ground ring 113 and power ring 114 help maintain electrical quality of the semiconductor package 1, and provide grounding effect and power supply as required for operation of the semiconductor chip 12.

However, due to dense arrangement of electronic elements and circuits on the highly integrated semiconductor chip, a large amount of heat is produced during operation; if the heat can not be effectively dissipated, it would seriously damage performance and lifetime of the semiconductor chip. Moreover, this package structure lacks sufficient shielding effect, and thereby is easily subject to external electromagnetic and noise interference.

In order to solve the foregoing problems, U.S. Pat. No. 6,020,637 discloses a cavity-down ball grid array (CDBGA) semiconductor package; as shown in FIG. 1b, this semiconductor package 2 comprises: a tape substrate 22, a heat spreader 200, a ground plane 202, at least a semiconductor chip 23, a plurality of bonding wires 24, an encapsulant 25 and a ball grid array 260.

The above semiconductor package 2 utilizes a two-layer heat sink 20 composed of the heat spreader 200, an adhesive layer 201 and the ground plane 202, wherein the ground plane 202 is formed with an opening 2020 for chip accommodation, and a ground ring 21 is disposed around the opening 2020. The substrate 22 is attached to the ground plane 202, and formed with a plurality of vias 220. The semiconductor chip 23 is mounted to the heat spreader 200 by means of the adhesive layer 201 and received within the opening 2020; this semiconductor chip 23 is electrically connected to the ground ring 21 by a plurality of first bonding wires 240a, and electrically connected to conductive traces (not shown) formed on the substrate 22 by a plurality of second bonding wires 240b, allowing the semiconductor chip 23 and bonding wires 240a, 240b to be encapsulated by the encapsulant 25. And, a plurality of solder balls 260a, 260b are implanted on the substrate 22, wherein the solder balls 260a are connected to the vias 220 of the substrate 22 for allowing the heat sink 20 to be electrically connected to a printed circuit board (PCB, not shown) by the vias 220 and solder balls 260a (ground balls).

Although the above semiconductor package 2 provides solutions to the problems of heat dissipation and electromagnetic interference, it requires complex fabrication processes and high costs; further, voids may be easily formed in the vias 220 during fabrication, thereby degrading electrical connection between the ground balls 260a and the ground plane 202.

Furthermore, the ground ring 21 of the ground plane 202 used in the above semiconductor package 2 is also made by complex processes. First, the ground ring 21 is formed by plating gold (Au) or silver (Ag) over the ground plane 202; then, a black oxidation process is performed at area other than the ground ring 21 on the ground plane 202, allowing the ground plane 202 to have good adhesion to the tape substrate 22. However, the black oxidation process would easily contaminate the pre-formed ground ring 21, and thus degrade bondability of the first bonding wires 240a and adherence between the ground ring 21 and the encapsulant 25, thereby adversely affecting quality and reliability of fabricated products.

Therefore, the problem to be solved herein is to provide a semiconductor package, which can simplify fabrication processes, reduce costs, and solve the problems of heat dissipation, electromagnetic interference and crosstalk effect.

SUMMARY OF THE INVENTION

A primary objective of the present invention is to provide a cavity-down ball grid array (CDBGA) semiconductor package with a heat spreader, wherein a substrate is mounted in a cavity of the heat spreader, and an electrically conductive adhesive is applied between an inner wall of the cavity and edges of the substrate, whereby the heat spreader can be electrically connected to a metal ground layer exposed to the edges of the substrate by means of the electrically conductive adhesive, so as to simplify fabrication processes, reduce costs, and solve problems of heat dissipation, electromagnetic interference and crosstalk effect.

In accordance with the above and other objectives, the present invention proposes a CDBGA semiconductor package with a heat spreader, comprising: a substrate having a first surface and a second surface, and formed with an opening, a metal ground layer exposed to edges of the substrate, at least a ground ring formed at peripheral area on the second surface of the substrate, and a plurality of ground vias; a heat spreader formed with at least a cavity, allowing the substrate to be mounted in the cavity with the first surface of the substrate being attached to the heat spreader; a semiconductor chip having a circuit surface and a non-circuit surface, and mounted in the opening of the substrate with the non-circuit surface of the semiconductor chip being attached to the heat spreader; an electrically conductive adhesive for connecting the exposed metal ground layer and the ground ring of the substrate to an inner wall of the cavity of the heat spreader, allowing the ground layer and ground ring to be electrically coupled to the heat spreader by the electrically conductive adhesive; a plurality of bonding wires for electrically connecting the semiconductor chip to the substrate; an encapsulant for encapsulating the semiconductor chip and bonding wires; and a plurality of solder balls implanted on the second surface of the substrate, for electrically connecting the semiconductor chip to an external device The above CDBGA semiconductor package according to the invention is characterized in the use of the electrically conductive adhesive being applied between edges of the substrate and the cavity of the heat spreader, so as to allow the exposed ground layer and the ground ring to be electrically coupled to the heat spreader via the electrically conductive adhesive. As a result, by simplified processes and lower costs for fabricating the semiconductor package, the heat spreader can be included in a grounding circuit path of the semiconductor chip, and heat produced from the semiconductor chip can be effectively dissipated via the heat spreader. This thereby prevents floating ground effect and excess grounding resistance, and solves problems of heat dissipation, electromagnetic interference and crosstalk effect.

BRIEF DESCRIPTION OF THE DRAWINGS

The present invention can be more fully understood by reading the following detailed description of the preferred embodiments, with reference made to the accompanying drawings, wherein:

FIG. 2b is a planar view of the CDBGA semiconductor package shown in FIG. 2a;

FIG. 3b is a planar view of the CDBGA semiconductor package shown in FIG. 3a.

DETAILED DESCRIPTION OF THE PREFERRED EMBODIMENTS

First Preferred Embodiment

Figure 1A:
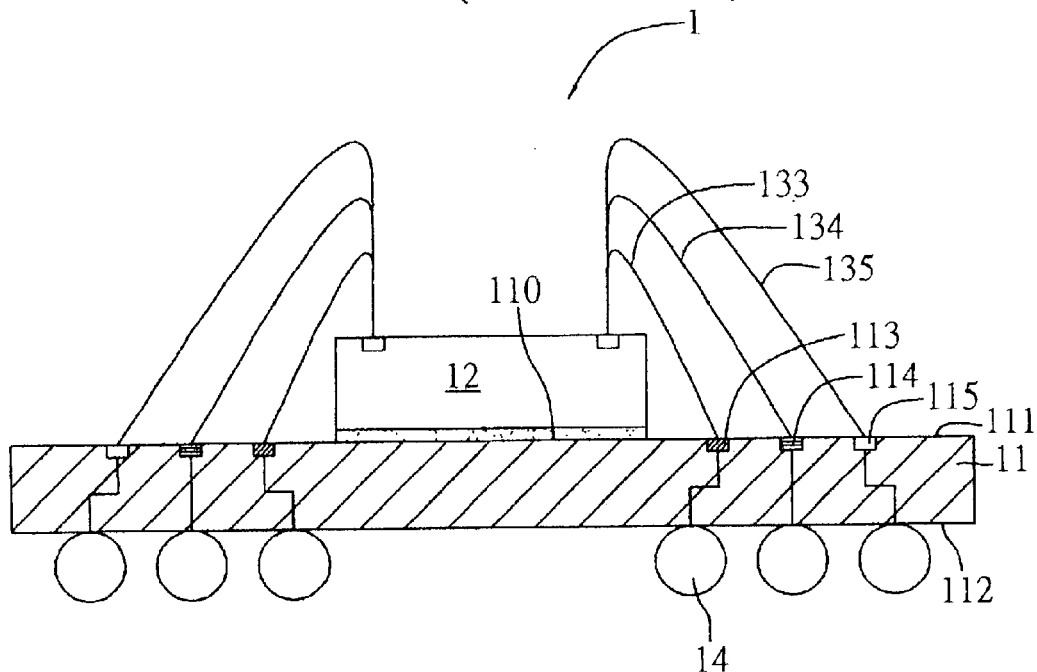
FIG. 1a (PRIOR ART) is a cross-sectional view of a conventional BGA semiconductor package.
Figure 1B:
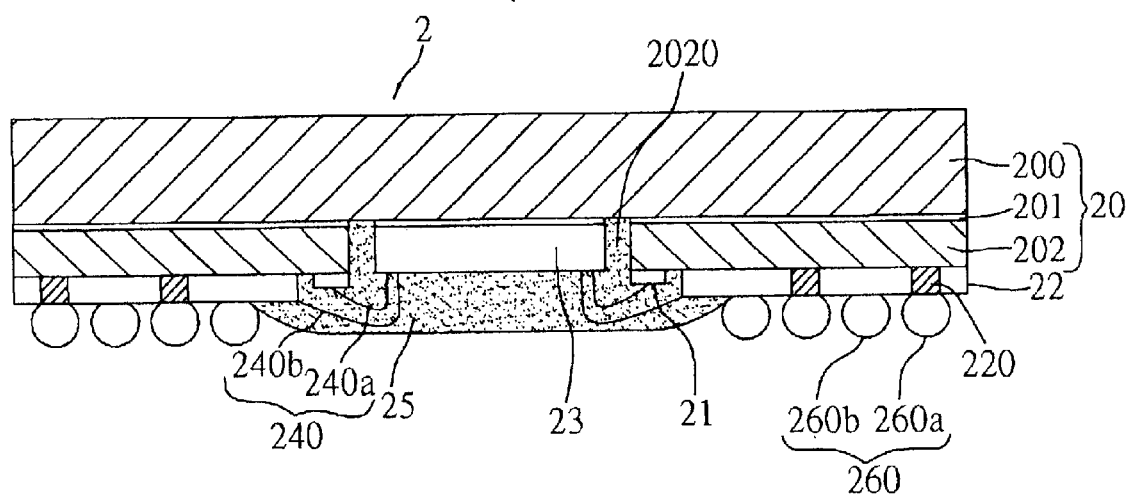
FIG. 1b (PRIOR ART) is a cross-sectional view of a conventional CDBGA semiconductor package.
Figure 2A:
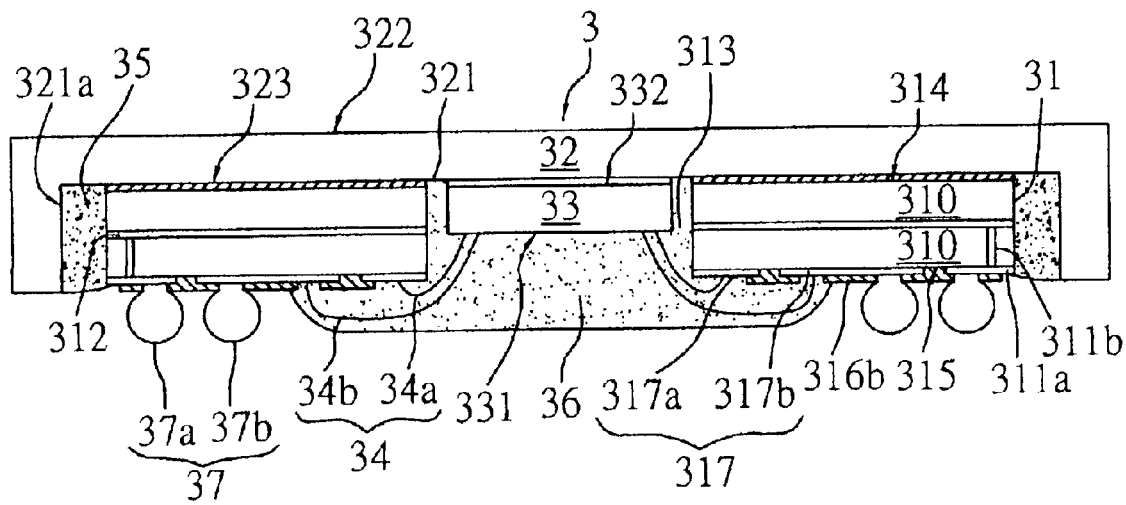
FIG. 2a is a cross-sectional view of a CDBGA semiconductor package with a heat spreader according to a first preferred embodiment of the invention.
Figure 2B:
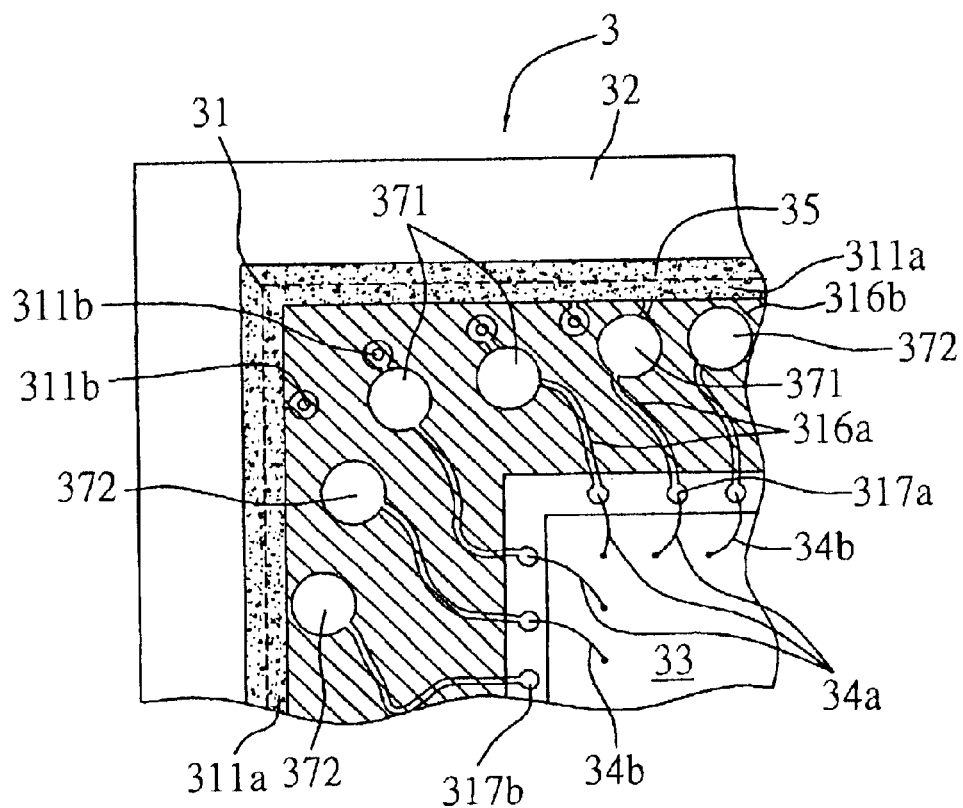

FIGS. 2a and 2b illustrate a cavity-down ball grid array (CDBGA) semiconductor package with a heat spreader according to a first preferred embodiment of the present invention.

As shown in the drawings, this CDBGA semiconductor package 3 is composed of a substrate 31 having a first surface 314 and a second surface 315, and the substrate 31 is formed with at least a ground ring 311a exposed at peripheral area on the second surface 315 of the substrate 31, a plurality of ground vias 311b, a metal ground layer 312 exposed to edges of the substrate 31, and an opening 313. A heat spreader 32 is formed with at least a cavity 321, allowing the first surface 314 of the substrate 31 to be coupled to the cavity 321. At least a semiconductor chip 33 is mounted on a surface of the heat spreader 32 and received in the opening 313 of the substrate 31, and electrically connected to the second surface 315 of the substrate 31 by a plurality of bonding wires 34. An electrically conductive adhesive 35 is applied for connecting the exposed metal layer 312 and the ground ring 311a to an inner wall 321a of the cavity 321 of the heat spreader 32, allowing the ground layer 312 and ground ring 311a to be electrically coupled to the heat spreader 32 by the electrically conductive adhesive 35. An encapsulant 36 is formed and encapsulates the semiconductor chip 33, the plurality of bonding wires 34 and partly the substrate 31. And, a plurality of solder balls 37 are implanted on the second surface 315 of the substrate 31, and electrically connect the semiconductor chip 33 to an external device (not shown).

The substrate 31 is composed of a plurality of core layers 310 (two as shown in FIG. 2a) made by a conventional resin material such as FR4 resin, glass rein, BT resin, ceramics or polyimide resin. At least a metal ground layer 312 is disposed between the core layers 310, and exposed to edges of the substrate 31. The substrate 31 has a first surface 314 and a second surface 315, and is formed with an opening 313 penetrating through the first and second surfaces 314, 315, wherein a wire bonding region is defined around the opening 313 on the second surface 315 of the substrate 31 and formed with a plurality of conductive traces 316a (as shown in FIG. 2b) that are made by etching a copper film applied on the substrate 31. Solder mask 316b is applied over the wire bonding region to hermetically cover the conductive traces 316a. The wire bonding region is further formed with a plurality of bond fingers 317 and a ground ring 311a, wherein the bond fingers 317 at least include ground fingers 317a and signal fingers 317b, and the ground ring 311a is disposed at peripheral area on the substrate 31; and the substrate 31 is formed with a plurality of vias 311b that electrically connect the ground ring 311a to the metal ground layer 312. Moreover, the second surface 315 of the substrate 31 is further formed with a plurality of ground pads 371 and signal pads 372, allowing the ground pads 371 to be electrically connected to the ground ring 311a via the conductive traces 316a or to the ground layer 312 via the vias 311b.

The heat spreader 32 has an upper surface 322 and a lower surface 323, and is formed with at least a cavity 321 on the lower surface 323 thereof, allowing the substrate 31 to be received in the cavity 321 of the heat spreader 32 with the first surface 314 of the substrate 31 being coupled to the heat spreader 32. The heat spreader 32 is made of a thermally conductive and rigid material such as copper, and then subject to a selective black oxidation process to form a copper oxide layer (not shown) or to a micro-etching process over surfaces of the cavity 321 of the heat spreader 32, so as to enhance adherence between the heat spreader 32 and the substrate 31.

The semiconductor chip 33 has a circuit surface 331 and a non-circuit surface 332, allowing the semiconductor chip 33 to be received in the opening 313 of the substrate 31 with the non-circuit surface 332 of the semiconductor chip 33 being mounted to the cavity 321 of the heat spreader 32, such that heat produced from operation of the semiconductor chip 33 can be dissipated via the heat spreader 32.

The plurality of bonding wires 34 include first bonding wires 34a and second bonding wires 34b. The first bonding wires 34a are used to electrically connect the semiconductor chip 33 to the ground fingers 317a, and the second bonding wires 34b are used to electrically connect the semiconductor chip 33 to the signal fingers 317b and power fingers (not shown) on the substrate 31.

The electrically conductive adhesive 35 is applied between the edges of the substrate 31 and the inner wall 321a of the cavity 321 of the heat spreader 32, for allowing the exposed ground layer 312 and ground ring 311a to be electrically connected to the heat spreader 32 via the electrically conductive adhesive 35, so as to eliminate internal and external noise generation. In fabrication, the electrically conductive adhesive 35 may be first applied over the inner wall 321a of the cavity 321 of the heat spreader 32, then allowing the substrate 31 to be mounted to the electrically conductive adhesive 35 and received in the cavity 321.

The encapsulant 36 is made of a conventional resin material such as epoxy resin and fills into the opening 313 of the substrate 31 for encapsulating the semiconductor chip 33 and bonding wires 34.

The plurality of solder balls 37 include first solder balls 37a and second solder balls 37b, wherein the first solder balls 37a are respectively bonded to the ground pads 371 on the substrate 31, and the second solder balls 37b are bonded to the signal pads 372 and power pads (not shown), so as to electrically connect the semiconductor chip 33 to an external device such as printed circuit board (PCB) via the solder balls 37. This thereby completes the CDBGA semiconductor package 3 according to the invention.

The above CDBGA semiconductor package 3 utilizes the electrically conductive adhesive 35 applied between the edges of the substrate 31 and the cavity 321 of the heat spreader 32, so as to allow the exposed ground layer 312 and the ground ring 311a to be electrically coupled to the heat spreader 32 via the electrically conductive adhesive 35. As a result, the heat spreader 32 is included in a grounding circuit path of the semiconductor chip 33 to thereby prevent floating ground effect and excess grounding resistance, and to allow external noise to be transmitted via the heat spreader 32, electrically conductive adhesive 35, ground layer 312 or ground ring 311a, and first solder balls 37a to the external printed circuit board, so as to simplify fabrication processes, reduce costs, and solve problems of heat dissipation, electromagnetic interference and crosstalk effect.

Second Preferred Embodiment

Figure 3A:
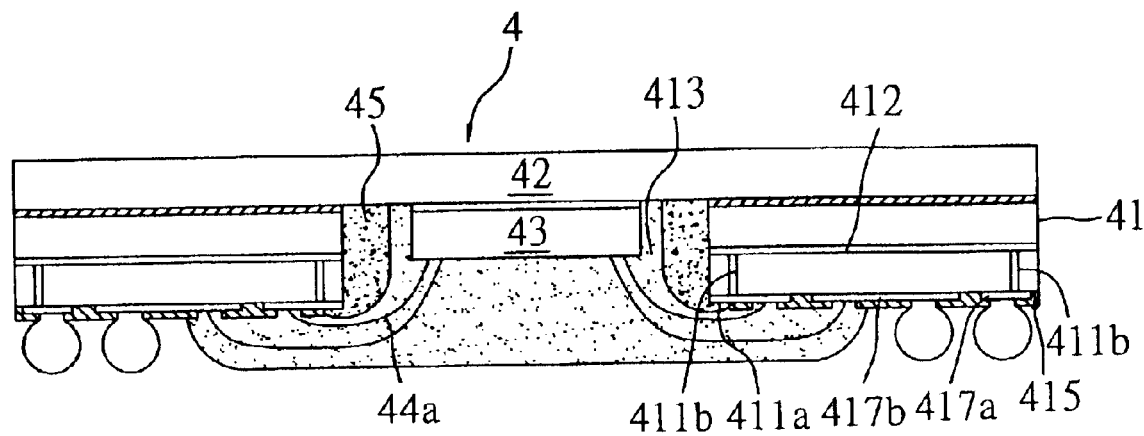
FIG. 3a is a cross-sectional view of a CDBGA semiconductor package with a heat spreader according to a second preferred embodiment of the invention.
Figure 3B:
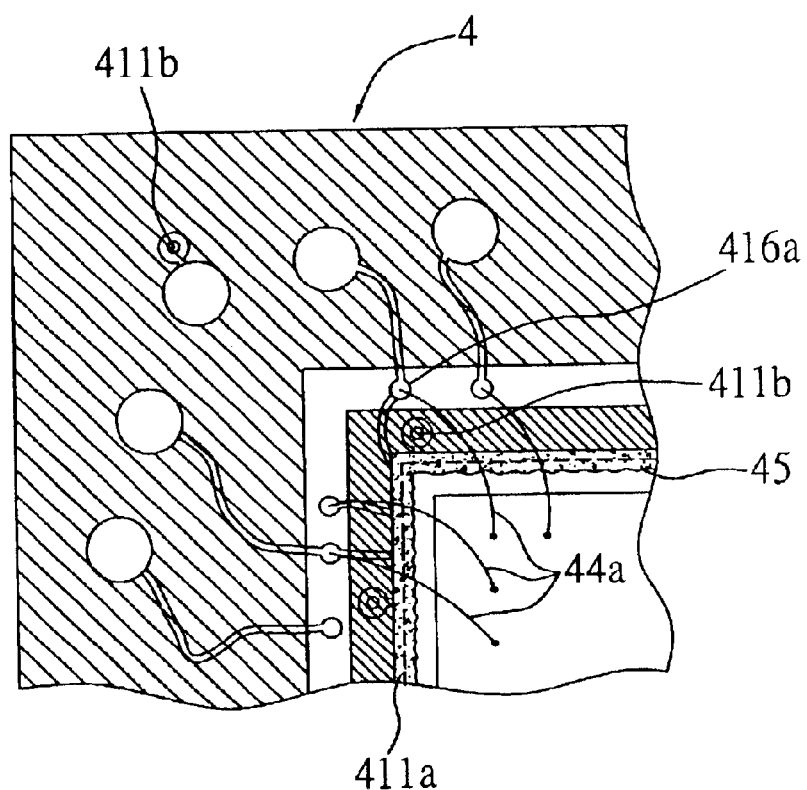

FIGS. 3a and 3b illustrate the CDBGA semiconductor package according to a second preferred embodiment of the invention. As shown in the drawings, the semiconductor package 4 of the second embodiment is structurally similar to that recited in the first embodiment, with the difference in that a heat spreader 42 of the semiconductor package 4 is shaped as a flat plate without forming a cavity. Further, a ground ring 411a is formed around an opening 413 of a substrate 41, and a plurality of ground fingers 416a and signal fingers 417b are formed on a second surface 415 of the substrate 41, allowing the ground ring 411a and ground fingers 416a to be electrically connected to a ground layer 412 of the substrate 41 via ground vias 411b formed in the substrate 41. Moreover, an electrically conductive adhesive 45 is applied over an inner side wall of the opening 413 of the substrate 41, and electrically connects the ground layer 412 and ground ring 411a to the heat spreader 42, whereby a semiconductor chip 43 received in the opening 413 of the substrate 41 can be electrically coupled to the ground ring 411a via first bonding wires 45a, and the heat sink 42 can be included in a grounding circuit path of the semiconductor package 4.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A cavity-down ball grid array (CDBGA) semiconductor package, comprising:
    a substrate having a first surface and a second surface, wherein at least a ground ring and a plurality of ground vias are formed on the second surface of the substrate, and a metal ground layer and an opening are formed in the substrate, with the metal ground layer being exposed to edges of the substrate;
    a heat spreader having an upper surface and a lower surface, wherein at least a cavity is formed on the upper surface, allowing the substrate to be mounted in the cavity with the first surface of the substrate being attached to the heat spreader;
    an electrically conductive adhesive for electrically connecting the exposed metal ground layer and the ground ring of the substrate to an inner wall of the cavity of the heat spreader;
    a semiconductor chip mounted on the lower surface of the heat spreader and received in the opening of the substrate;
    a plurality of bonding wires for electrically connecting the semiconductor chip to the substrate;
    an encapsulant for encapsulating the semiconductor chip and bonding wires; and
    a plurality of solder balls implanted on the second surface of the substrate, for electrically connecting the semiconductor chip to an external device.

2. The CDBGA semiconductor package of claim 1, wherein the ground ring is formed at peripheral area on the second surface of the substrate.

3. The CDBGA semiconductor package of claim 1, wherein the ground vias are formed through the substrate, for electrically connecting the ground ring to the ground layer.

4. The CDBGA semiconductor package of claim 1, wherein the second surface of the substrate is formed with a plurality of ground fingers, signal fingers and power fingers thereon.

5. The CDBGA semiconductor package of claim 4, wherein the bond wires include first bonding wires and second bonding wires, the first bonding wires for electrically connecting the semiconductor chip to the ground fingers, and the second bonding wires for electrically connecting the semiconductor chip to the signal fingers and power fingers.

6. A cavity-down ball grid array (CDBGA) semiconductor package, comprising:
    a substrate having a first surface and a second surface, wherein at least a ground ring and a plurality of ground vias are formed on the second surface of the substrate, and a metal ground layer and an opening are formed in the substrate, with the metal ground layer being exposed to edges of the substrate;
    a heat spreader attached to the first surface of the substrate;
    an electrically conductive adhesive for electrically connecting the exposed metal ground layer and the ground ring of the substrate to the heat spreader;

a semiconductor chip mounted to the heat spreader and received in the opening of the substrate;

a plurality of bonding wires for electrically connecting the semiconductor chip to the substrate;

an encapsulant for encapsulating the semiconductor chip and bonding wires; and a plurality of solder balls implanted on the second surface of the substrate, for electrically connecting the semiconductor chip to an external device.

7. The CDBGA semiconductor package of claim 6, wherein the ground ring is formed at peripheral area on the second surface of the substrate.

8. The CDBGA semiconductor package of claim 6, wherein the second surface of the substrate is formed with a plurality of ground fingers, signal fingers and power fingers thereon.

9. The CDBGA semiconductor package of claim 6, wherein the ground vias are formed through the substrate, for electrically connecting the ground ring to the ground layer.

10. The CDBGA semiconductor package of claim 8, wherein the bond wires include first bonding wires and second bonding wires, the first bonding wires for electrically connecting the semiconductor chip to the ground fingers, and the second bonding wires for electrically connecting the semiconductor chip to the signal fingers and power fingers.

* * * * *